United States Patent [19]

Izumi et al.

[11] 4,241,359
[45] Dec. 23, 1980

[54] SEMICONDUCTOR DEVICE HAVING BURIED INSULATING LAYER

[75] Inventors: Katsutoshi Izumi, Seki; Masanobu Doken; Hisashi Ariyoshi, both of Tokyo, all of Japan

[73] Assignee: Nippon Telegraph and Telephone Public Corporation, Tokyo, Japan

[21] Appl. No.: 882,738

[22] Filed: Mar. 2, 1978

[30] Foreign Application Priority Data

Nov. 28, 1977 [JP] Japan .................... 52-141599

[51] Int. Cl.³ .................. H01L 27/12; H01L 29/78; H01L 29/06
[52] U.S. Cl. ..................... 357/49; 357/23; 357/34; 357/56; 357/91; 29/571
[58] Field of Search .................... 357/49, 91

[56] References Cited
U.S. PATENT DOCUMENTS

| | | | |
|---|---|---|---|
| 3,622,382 | 11/1971 | Brack et al. | 357/91 |
| 3,666,548 | 5/1972 | Brack et al. | 357/91 |
| 3,707,765 | 1/1973 | Coleman | 357/91 |
| 3,726,719 | 4/1973 | Brack et al. | 357/91 |
| 3,791,024 | 2/1974 | Boleky | 357/23 |
| 3,840,409 | 10/1974 | Ashar | 357/91 |
| 3,855,009 | 12/1974 | Lloyd et al. | 357/91 |
| 3,873,373 | 3/1975 | Hill | 357/91 |
| 3,886,587 | 5/1975 | Nicolay | 357/49 |
| 4,017,341 | 4/1977 | Suzuki | 357/49 |

*Primary Examiner*—Gene M. Munson
*Attorney, Agent, or Firm*—Claude A. S. Hamrick

[57] ABSTRACT

A semiconductor manufacturing method and device made therefrom by forming an insulating $SiO_2$ film on both surfaces of a silicon substrate using an ion implantation process to form a buried $SiO_2$ layer within the substrate a predetermined depth beneath one of the substrate surfaces, isolating a body of the substrate layer lying above the buried layer, and forming a semiconductive device in the isolated body. The surface layers of $SiO_2$ serve to mechanically balance the internal strains generated within the substrate during the formation of the buried layer and thereby prevent the creation of mechanical imperfections in the surface portions of the substrate.

8 Claims, 15 Drawing Figures

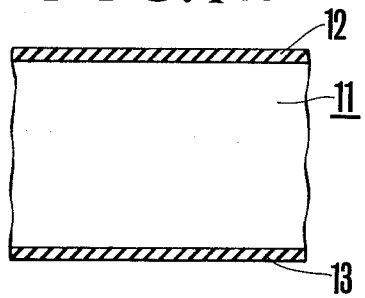
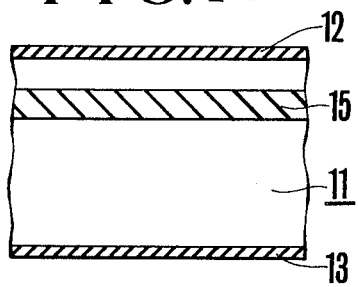
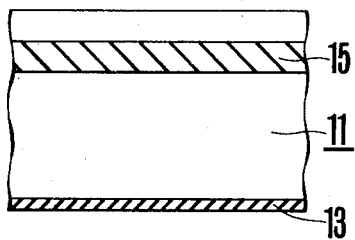
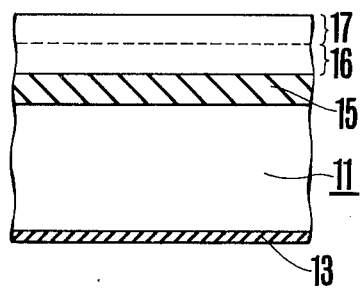
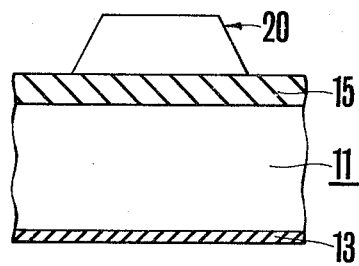
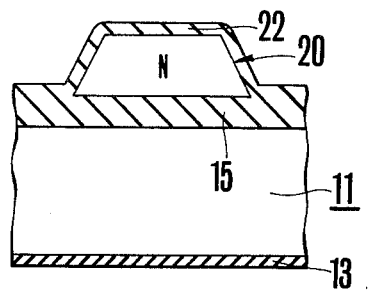
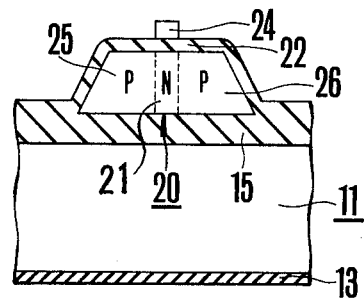
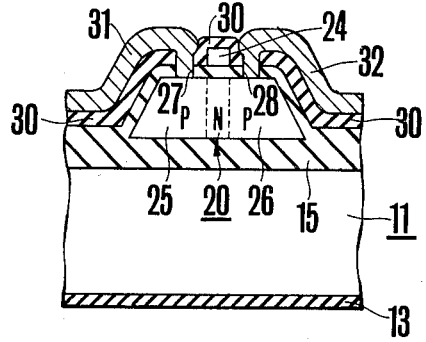

SEMICONDUCTOR DEVICE HAVING BURIED INSULATING LAYER

BACKGROUND OF THE INVENTION

1. Field of the Invention

This invention relates to a semiconductor device, and more particularly to a semiconductor device prepared by forming an insulating layer on a semiconductor substrate by an ion implantation technique and semiconductor elements or semiconductor integrated circuits are formed by using at least one of the semiconductor layers isolated by the insulating layer.

2. Description of the Prior Art

Various methods have been proposed to decrease the isolation area between semiconductor elements and the junction capacitance and to completely isolate the semiconductor elements of a semiconductor integrated circuit for the purpose of increasing the degree of integration of the circuit, operation speed and reliability. As disclosed in U.S. Pat. No. 3,855,009, for example, a semiconductor device is prepared by implanting ions of oxygen or nitrogen into a monocrystalline silicon wafer, annealing the wafer to form an insulating layer consisting of a compound of the implanted ions and silicon, epitaxially depositing silicon on the insulating layer, and forming a semiconductor element or a semiconductor integrated circuit on the epitaxial silicon layer.

However, when using such a method, it is difficult to obtain semiconductor devices having desired characteristics for the following reasons:

Firstly, since ions of oxygen, for example, are directly implanted into the semiconductor substrate at the time of ion implantation, the surface of the substrate is contaminated by carbon contained in the space through which the ion beam passes. The origin of such carbon is the mist of diffusion oil used in a diffusion pump. For this reason, when the epitaxial silicon layer is formed after annealing the substrate, such lattice defects as dislocation and stacking faults will be formed when the degree of contamination is high. Furthermore, when an MOS transistor is formed by diffusing an impurity directly into a silicon wafer formed with an insulating layer, the contaminated surface directly affects the characteristics of the MOS transistor. Accordingly, in the semiconductor device prepared by the method disclosed in the above U.S. patent, it is necessary to etch the surface of the substrate after the annealing step.

Secondly, in the semiconductor device prepared using the above patented method, since the thermal expansion coefficient of the region of the insulating layer formed by implanting ions in a cooling step subsequent to annealing differs greatly from that of the silicon substrate, strain is induced in the silicon substrate thereby tending to bend it. Where a silicon oxide layer is formed as the insulating layer by implanting oxygen ions, the thermal expansion coefficient $0.48 \times 10^{-6}$ per degree C. of the $SiO_2$ layer is about 1/10 of the $4.68 \times 10^{-6}$ per degree C. coefficient of the silicon wafer. When oxygen ions were implanted into a 3-inch silicon wafer having a thickness of 350 microns with an implantation energy of 150 KeV, and a dose of $1.2 \times 10^{18}$ atoms/cm², and then annealed at a temperature of 1150° C. for two hours, the silicon wafer was flexed 38 microns. When the silicon wafer flexes in this manner, crystal defects and cracks are formed in the surface layer of the silicon wafer due to strain. Consequently, when an epitaxial silicon layer is formed directly on the silicon wafer or an impurity is directly diffused into the silicon wafer, the crystal defects and cracks cause problems similar to those caused by the contamination of the surface. Furthermore, as such crystal defects and cracks reach considerable depths relative to the wafer surface, such defects cannot be eliminated completely even when the wafer surface is etched after annealing as taught by the above-mentioned U.S. patent.

SUMMARY OF THE PRESENT INVENTION

Accordingly, it is an object of this invention to provide an improved semiconductor device having a buried insulating layer and a method of manufacturing the same wherein the substrate does not bend even when an insulating film is formed on a semiconductor substrate using an ion implantation technique.

Another object of this invention is to provide an improved semiconductor device having a buried insulating layer and a method of manufacturing the same wherein when an insulating layer is formed on a semiconductor substrate using an ion implantation technique, lattice defects and cracks are not formed in the surface of the semiconductor substrate implanted with ions.

Still another object of this invention is to provide an improved semiconductor device having a buried insulating layer and a method of manufacturing the same, wherein the surface of the semiconductor substrate is not contaminated when an insulating layer is formed on the surface of the substrate using an ion implantation technique.

Yet another object of this invention is to provide a semiconductor device and a method of manufacturing the same wherein when a buried insulating layer is formed in a semiconductor substrate using an ion implantation technique and a semiconductor island is formed on the buried insulating layer, microgaps and cracks will not be formed at the boundary between the buried insulating layer and any other insulating layer that covers the semiconductor islands.

A further object of this invention is to provide a semiconductor device and a method of manufacturing the same wherein when a buried insulating layer is formed in a semiconductor substrate using an ion implantation technique and then a semiconductor island is formed on the buried insulating layer, the leakage current to the substrate from the islands is negligibly small.

Still further object of this invention is to provide an improved semiconductor device and a method of manufacturing the same wherein "bird beaks" are not formed at the ends of the insulating region as in the local oxidation of silicon.

Another object of this invention is to provide a novel semiconductor device and a method of manufacturing the same capable of decreasing the area of PN junction as well as the junction capacitance.

According to one aspect of this invention there is provided a semiconductor device for inclusion in an integrated circuit and comprising a semiconductor substrate, an insulating film formed on one surface of the substrate, a buried insulating compound layer disposed at a predetermined depth from the other surface of the semiconductor substrate, the buried insulating compound layer being formed by implanting ions through the other surface, and semiconductor circuit elements formed in a portion of the layer of the substrate between the buried insulating compound layer and the other surface of the substrate. The insulating film formed on the one surface of the substrate has a thickness sufficient to compensate for the strain induced in the buried insulating compound layer.

According to another aspect of this invention, there is provided a method of manufacturing a semiconductor device comprising the steps of forming first and second insulating films on the upper and lower surfaces of a semiconductor substrate; using an ion implantation technique to implant a substance which imparts an insulating property to the semiconductor substrate into a predetermined depth from the upper surface of the semiconductor substrate through the first insulating film; annealing the substrate to form an insulating compound layer implanted with the ions of the substrate at a predetermined depth from the first surface of the semiconductor substrate; removing the first insulating film; and forming a circuit of a desired semiconductor element by using a portion of the semiconductor layer between the insulating compound layer and the first surface of the semiconductor substrate; the second insulating film having a thickness sufficient to compensate for the strain induced when the insulating compound layer is formed.

According to a modified embodiment of this invention, there is provided a method of manufacturing a semiconductor device comprising the steps of forming first and second insulating films on first and second surfaces of a semiconductor substrate; implanting by ion implantation technique a substance which imparts an insulating property to the semiconductor substrate at a predetermined depth from the first surface of the semiconductor substrate through the first insulating film; and forming a circuit of a desired semiconductor element by using the semiconductor layer between the insulating compound layer and the first surface of the semiconductor substrate, said second insulating layer having a thickness sufficient to compensate for the strain induced at the time of forming the buried insulating layer.

According to a further modification of this invention, there is provided a method of manufacturing a semiconductor device comprising the steps of forming first and second insulating films respectively on first and second surfaces of a semiconductor substrate; implanting by ion implantation technique through the first insulating film a substance which imparts an insulating property to the semiconductor substrate at a predetermined depth of the semiconductor substrate; annealing the substrate to form a buried insulating compound layer implanted with the ions of the substrate at a predetermined depth from the first surface of the substrate; removing the first insulating film; forming an epitaxially-grown layer on the first surface of the semiconductor substrate; selectively etching a semiconductor layer bounded by the epitaxially-grown layer, the first surface of the semiconductor substrate and the buried insulating compound layer for forming a semiconductor island; forming an additional insulating layer over the exposed area of the semiconductor island; forming a polycrystalline silicon member acting as a gate electrode on the additional insulating layer overlying the semiconductor island; implanting an impurity into the semiconductor island to form source and drain regions in the semiconductor island by using the polycrystalline silicon member as a mask; and connecting source and drain electrodes to the source and drain regions respectively; said second insulating layer having a thickness sufficient to compensate for the strain induced in the substrate at the time of forming the insulating compound layer.

According to yet another embodiment of this invention, there is provided a method of manufacturing a semiconductor device comprising the steps of forming first and second insulating films respectively on first and second surfaces of a semiconductor substrate; forming a third insulating film having a predetermined pattern on the first insulating film; implanting by ion implantation technique a substance which imparts an insulating property to a semiconductor substrate into a predetermined depth of the semiconductor substrate through the first insulating film; removing the first insulating film; heat treating the semiconductor substrate to form a fourth insulating film on the first surface of the semiconductor substrate and to convert a layer of the substrate implanted with the ions of the substance into an insulating compound layer; depositing a polycrystalline silicon layer on the fourth insulating layer; forming a fifth insulating film on the polycrystalline silicon layer; etching the polycrystalline silicon layer and the fifth insulating layer into a pattern wherein the polycrystalline silicon layer can be used as a gate electrode; forming a second insulating compound layer at a predetermined depth from the first surface of the semiconductor substrate by using the etched polycrystalline silicon layer and the fifth insulating layer as a mask; forming source and drain regions in a semiconductor island bounded by the first and second insulating compound layers; and connecting source and drain electrodes to the source and drain regions respectively; said second insulating film having a thickness sufficient to compensate for the strain induced in the substrate at the time of forming the insulating compound layers.

IN THE DRAWING

FIGS. 1A through 1H are sectional views showing the successive steps of manufacturing a semiconductor device having a buried insulating layer, an MOS field effect transistor in this example, according to the method of this invention;

DETAILED DESCRIPTION OF THE PREFERRED EMBODIMENTS

Figure 2:
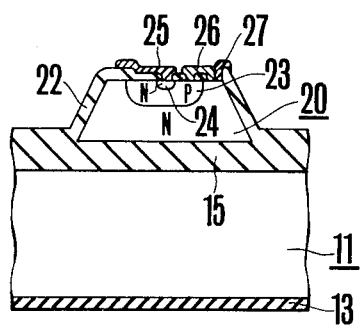
FIG. 2 is a sectional view showing a bipolar transistor manufactured by the method of this invention.

A preferred embodiment of the semiconductor device of this invention and a method of manufacturing the same will be described hereunder with reference to FIGS. 1A through 1H. In this example, the semiconductor device comprises an MOS field effect transistor.

A phosphorus doped silicon wafer 11 having a thickness of 350 microns and a resistivity of 1800 ohm-cm is prepared. The silicon wafer 11 is heat-treated for 50 minutes at a temperature of 1100° C. in an oxygen atmosphere to form silicon oxide films 12 and 13 on the opposite surfaces of the silicon wafer. This state is shown in FIG. 1A. Then a substance which imparts an insulating property to the silicon wafer 11 is implanted thereinto through the upper silicon oxide film 12 using an ion implantation process. In this example, oxygen ions are implanted into the silicon wafer under an implantation energy of 150 KeV and a dose of $1.2 \times 10^{18}$ atoms/cm². Under these conditions, the oxygen ions penetrate the silicon oxide film 12 and distribute such that the ion concentration is largest at a predetermined depth from the surface of the silicon wafer and smallest near the surface.

The silicon wafer is then annealed for 2 hours at a temperature of 1150° C. to cause the oxygen ions in the silicon substrate to combine with the silicon atoms and form a silicon dioxide ($SiO_2$) layer 15 as shown in FIG. 1B. This silicon dioxide layer 15 has a thickness of 2800 Å and its upper surface is located at a depth of 2600 Å from the surface of the silicon oxide layer 12. Even when the oxygen ions are implanted into the silicon wafer 11, since the opposite surfaces thereof are covered by the silicon oxide films 12 and 13, these films 12 and 13 alleviate the strain caused by the implanted oxygen ions.

According to the Applicants' experiment, thicknesses of 100 to 300 Å for the silicon oxide films were found sufficient to absorb the strain caused by the ion implantation under the conditions described above. If the oxide film 12 through which the oxygen ions are implanted is too thick, knocked-on oxygen ions will distribute too much immediately beneath the oxide film 12 thus inducing crystal defects at these portions, and when the implantation energy is constant, the depth of the implanted oxygen ions will be decreased. For this reason, the thickness of the silicon oxide film 12 may be substantially smaller than the thickness of the silicon oxide film 13 on the opposite side. With this construction the object of the invention can be accomplished because the difference in the strains is small, as will be discussed later. It is to be understood that other insulating films may be substituted for the silicon oxide films; for example, silicon nitride $Si_3N_4$ films. Alternatively, one surface of the silicon wafer may be covered by a silicon oxide film while the other is covered by a silicon nitride film.

Of the two silicon oxide films 12 and 13 formed on the surfaces of the silicon wafer, the film 12 is removed by using an etchant consisting of ammonium fluoride ($NH_4F$) and hydrogen fluoride (HF). At this time, even when the silicon oxide film 12 is removed, the silicon wafer 11 does not bend, since the silicon dioxide $SiO_2$ layer 15 formed in the silicon wafer 11 is close to the surface thereof. The strain induced when the silicon dioxide layer 15 is formed will be sufficiently absorbed or compensated for by the silicon oxide layer 13 on the rear surface of the wafer 11 thus preventing warping thereof.

In one example, when thermally oxidized $SiO_2$ films, each having a thickness of 250 Å were formed on both sides of the silicon wafer, oxygen ions were implanted through one of the $SiO_2$ films under conditions of an implantation energy of 150 KeV and a dose of $1.2 \times 10^{18}$ atoms/cm², and the wafer was annealed for two hours at a temperature of 1150° C., substantially no warping of the wafer was noted. For this reason, no crack is formed in the silicon wafer, and the formation of crystal defects can be minimized.

In the next step, an undoped monocrystalline silicon layer 17 having a thickness of 1 micron is formed on the silicon layer 16 of the silicon wafer 11 by a vapor growth technique as shown in FIG. 1D. At this time, since the surface of the silicon wafer 11 is not flexed and since the crystal defect is minimum, the monocrystalline silicon layer 17 formed on the silicon layer 16 has an excellent crystalline structure. The thickness of the monocrystalline silicon layer 17 is not limited to 1 micron but may be less than 5000 Å or larger than 10 microns, for example.

The silicon layers 16 and 17 are then etched using ordinary photolithographic and selective etching techniques; for example, a gas plasma etching process might be used to form a frustum-shaped silicon island 20 as shown in FIG. 1E. The purpose of forming a frustum is to provide step-coverage (gentle side slope with continuous upper layer). When the frustum is etched by any method of etching except ion beam etching, the surface of the frustum becomes smooth.

As shown in FIG. 1F, a silicon oxide film 22 is then formed on the surface of the silicon island 20 by thermal oxidation process. The conditions of forming the silicon oxide film 22 are oxygen atmosphere, 1100° C. and 24 minutes. The thickness of the oxide film 22 prepared under these conditions is 700 Å. The oxide film 22 completely surrounds the silicon island 20 together with the silicon dioxide film 15.

This construction should be compared with the prior art silicon-on-sapphire construction. Since in the silicon-on-sapphire construction, the substrate is made of sapphire and the layer formed on the substrate is made of material different from sapphire, such as silicon oxide, there is a tendency to form microgaps and cracks at the interface between sapphire and silicon dioxide.

To the contrary, according to this invention, since the silicon oxide film 22 which surrounds both the silicon island 20 and the buried insulating layer 15 is of the same type as the buried insulating layer, that is, a silicon base material, these two layers are compatible or bond well so that troubles inherent to the silicon-on-sapphire construction are avoided. To fabricate an MOS field effect transistor of the enhancement mode, for example, a thickness of from 500 to 1000 Å of the silicon dioxide film 22 is advantageous where it is desired to make the threshold voltage of the transistor be sufficiently small (1 to 2 V).

Then, ions of phosphorus, which is an N-type impurity, are implanted into the silicon island 20 to convert it into an N-type single crystalline silicon region under implantation conditions of an implantation energy of 70 KeV and a dose of $1 \times 10^{11}$ atoms/cm².

Thereafter, a phosphorus doped polycrystalline silicon layer having a thickness of 0.7 micron is deposited on the silicon oxide film 22 using a chemical vapor deposition technique. The phosphorus doped polycrystalline silicon layer is then selectively etched by conventional photolithographic and selective etching techniques to leave a portion 24 which is used to form a gate electrode. Then ions of boron are implanted into the island 20 by a self-aligning technique utilizing portion 24 as a mask under conditions of an implantation energy of 60 KeV and a dose of $1.3 \times 10^{15}$ atoms/cm². Subsequent to this ion implantation step, the wafer is annealed for 2.5 hours at a temperature of 1000° C. As a consequence, portions 25 and 26 of the silicon island 20 on opposite sides of a portion 21 lying immediately beneath the gate electrode 24 are formed as P-type source and drain regions, as shown in FIG. 1G.

The ions of boron implanted do not reach the portion of the silicon island lying immediately beneath gate electrode 24 because the implanted boron ions lose their energy in the polycrystalline silicon material and cannot penetrate the underlying portion of oxide film 22 to reach the silicon island. In addition, to form a semiconductor element in the silicon island 20, where it is desired to form an interconnection between it and other portions, or between other elements, such interconnections can be formed by using a polycrystalline silicon layer in the same manner as in the gate electrode 24.

Thereafter, a phosphosilicate glass (PSG) layer 30 containing a large quantity of phosphorus and acting as an interlayer insulating film is formed using a well known chemical vapor deposition technique.

Then, openings 27 and 28 for forming the source and drain electrodes are formed through the oxide films 22 and 30 overlying the portions 25 and 26 of the silicon island 20. A metal layer of aluminum, for example, is then deposited thereover and the source and drain electrodes 31 and 32 are formed by photolithographic and selective etching techniques, thereby completing an MOS field effect transistor using the silicon island 20.

The MOS field effect transistor fabricated as above described has a boundary state density of $5 \times 10^{10}$ particles/cm$^2$, a threshold voltage of $-1.7$ V, and a field effect mobility of 215 cm$^2$/V sec. The leakage current of this MOS field effect transistor is about 1/10 of that of a silicon-on-sapphire construction which was designed to isolate its component parts. It was also found that the semiconductor elements utilizing the novel substrate of this invention have excellent characteristics. In addition, since with the construction of this invention, the silicon island is completely isolated from the silicon substrate, the junction capacitance to the substrate is much smaller than that of the isolation construction using a PN junction. In this example, the junction capacitance was less than 1/10 that of the prior art. For this reason, it is possible to increase the operating speed of the element and to highly integrate the component parts.

FIG. 2 shows a modified embodiment of this invention wherein the invention is applied to a bipolar transistor in which the same component parts as in FIG. 1 are designated by the same reference numerals. The bipolar transistor shown in FIG. 2 comprises a base region 23, an emitter region 24, an emitter electrode 25, a base electrode 26 and a collector electrode 27. To fabricate this bipolar transistor, the steps shown in FIGS. 1A through 1F which were used to fabricate an MOS field effect transistor can also be used. Subsequent to the step shown in FIG. 1F, the P-type base region 23, and the N-type emitter region 24 are formed by conventional photolithographic and selective etching techniques and diffusion of an impurity in the same manner as the well known method of fabricating an ordinary vertical bipolar transistor. Then, openings are formed through a silicon oxide film and conventional photolithographic and selective etching techniques are used to form the emitter electrode 25, base electrode 26 and the collector electrode 27.

In the bipolar transistor fabricated by the method described above, since the silicon island 20 is completely surrounded by the silicon oxide films 22 and 15, it has better element isolating properties and smaller junction capacitance than conventional bipolar transistors.

FIGS. 3A through 3F show successive steps of another modified method of this invention.

Figure 3A:
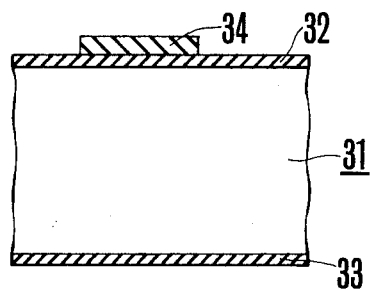
FIGS. 3A through 3F are sectional views showing successive steps of manufacturing an MOS field effect transistor according to a modified method of this invention.

Similar to the previous embodiment shown in FIG. 1, an N-type silicon wafer 31 having a thickness of 350 microns and a resistivity of 1800 ohm-cm is prepared. The silicon wafer is heat-treated in an oxygen atmosphere for 50 minutes at a temperature of 1100° C. to form silicon oxide films 32 and 33 having a thickness of 1000 Å on both sides of the wafer. On the silicon oxide film 32 is deposited a silicon dioxide (SiO$_2$) film having a thickness of 1 micron, and the wafer is then subjected to conventional photolithographic and selective etching steps to leave a portion of the silicon dioxide film 34, which is used as a mask, in a region in which ions are not implanted in the next step. This state is shown in FIG. 3A. Alternatively, the silicon dioxide film may be replaced by a polycrystalline silicon film or a silicon nitride film. The ion implantation conditions are: implantation energy of a voltage which varies continuously between 30 and 150 KeV and a dose of from $2 \times 10^{18}$ to $4 \times 10^{18}$ atoms/cm$^2$. As a consequence, oxygen implanted regions 35 and 36 are formed which extend to a depth of about 0.45 micron from the upper surface of the silicon wafer 31.

Figure 3B:
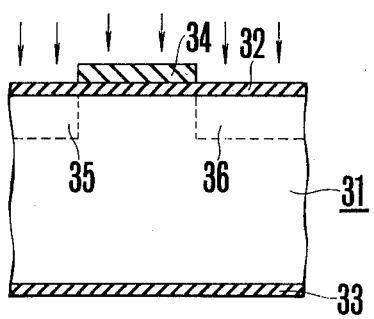
Figure 3C:
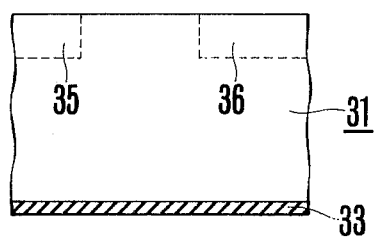

Then, the silicon oxide films 32 and 34 on the silicon wafer 31 are removed but leaving the silicon dioxide film 33 as shown in FIG. 3C. This is the feature of this invention. In the absence of this film, the silicon wafer 31 will be flexed by the strain induced in the wafer 31 by the implantation of the oxygen ions.

Figure 3D:
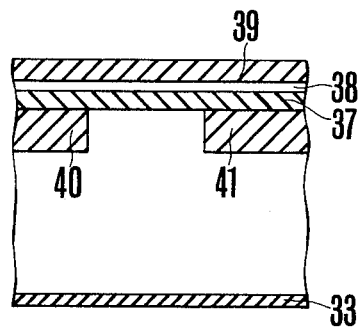

Next, as illustrated in FIG. 3D, a new silicon oxide film 37 having a thickness of 700 Å is formed on the upper surface of the silicon wafer 31 by maintaining the wafer in an oxygen atmosphere for 24 minutes at a temperature of 1100° C. At the same time, an additional oxide film (not shown) having a thickness of 350 Å is also formed on the oxide film 33 on the bottom surface of the silicon wafer 31. The oxide film 37 is used as the gate insulating film of the MOS field effect transistor to be fabricated.

Using a well known chemical vapor deposition process, a phosphorus-doped polycrystalline silicon layer 38 is then deposited on the oxide film 37 to a thickness of about 4000 to 5000 Å. Furthermore, a silicon oxide film 39 which acts as a mask for the material to be implanted by ion implantation is deposited on the polycrystalline silicon layer 38 using a chemical vapor deposition technique. In this step, the oxygen implanted regions 35 and 36 shown in FIG. 3C are converted into silicon oxide regions 40 and 41 acting as insulating regions due to the high temperature treatment for forming the silicon oxide film 37. This state is shown in FIG. 3D. During this step the silicon oxide film 33 prevents the silicon wafer 31 from being flexed by the strain induced by the silicon oxide regions 40 and 41.

Figure 3E:
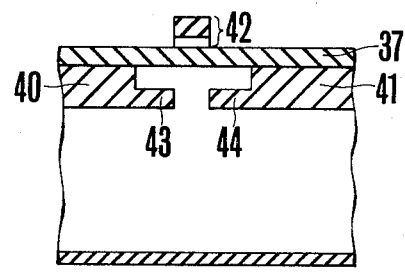

Using conventional photolithographic and selective etching techniques, the polycrystalline silicon layer 38 and the silicon oxide layer 39 are then formed into a mask 42 to be utilized for ion implantation. This mask is used as the gate electrode of an MOS field effect transistor to be formed. Thereafter, oxygen ions are implanted under an implantation energy of 150 KeV and a dose of $1.2 \times 10^{18}$ atoms/cm$^2$ followed by annealing for 2 hours at a temperature of 1150° C. Consequently, silicon oxide regions 43 and 44 are formed at a predetermined depth from the surface of the silicon wafer 31 as shown in FIG. 3E. These oxidized regions 43 and 44 act as insulating layers, but are not formed in the portion of the wafer just below the mask 42. Although the oxidized regions 43 and 44 are also formed in the already oxidized regions 40 and 41, they are not shown in the drawing.

Figure 3F:
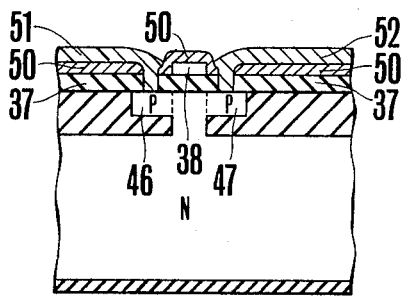

Then, by using a conventional method of fabricating an MOS field effect transistor, the oxide film overlying the source and drain regions 46 and 47 is selectively removed to form diffusion openings. At this time, the SiO₂ portion of the mask 42 is also removed. Then, a P-type impurity, for example boron, is doped through the openings with an implantation energy of 50 KeV, and a dose of $8 \times 10^{14}$ atoms/cm² to form P-type source and drain regions. In the next step, phosphosilicate glass film 50 is deposited onto the wafer surface followed by annealing carried out for 15 minutes at a temperature of 900° C. Then, this insulating film 50 is formed with contact holes. Thereafter, a metal layer is vacuum evaporated onto the wafer surface and this metal layer is selectively etched to form a source electrode 51 and a drain electrode 52, thus completing an MOS field effect transistor as shown in FIG. 3F.

With this construction, the source and drain regions are completely surrounded by oxidized silicon regions 40, 43, 44 and 41 (FIG. 3E) except for the channel side so that the source and drain regions do not form any PN junction with adjacent component elements except on the channel side. Accordingly, it is possible to greatly decrease the junction capacitance thereby assuring high operating speed for the element formed at this portion.

As can be clearly noted from the foregoing description, there is no fear of forming bird beaks at the ends of the insulating region as in the conventional local oxidation method of silicon, thereby eliminating the trouble of degradation at the ends. When exposed to space radiation the characteristic of the PN junction of the prior art device is greatly deteriorated whereas in the semiconductor device of this invention, since the PN junction is very small, it is possible to increase the reliability in such environment. In addition, according to this invention, it is possible to greatly decrease the irregularity of the wafer surface as compared with the prior art LOCOS (locally oxidized silicon) construction. Accordingly, it is possible to decrease breakage of any wiring formed on the substrate and to decrease the isolation areas of the elements.

In the embodiment shown in FIG. 3, instead of removing the oxide film 32 shown in FIG. 3B, as shown in FIG. 3C, it can be substituted by the oxide film 37 shown in FIG. 3D.

It should be understood that the invention is not limited to the specific embodiments described above and that many changes and modifications will no doubt become apparent to one skilled in the art after having read the foregoing specification. For example, in the embodiment shown in FIGS. 1 and 2, an epitaxially grown silicon layer was added to a silicon layer overlying a buried insulating layer for the purpose of forming a silicon island, but it is also possible to form only the silicon island. In this case, since the crystal structure of the silicon layer overlying the buried insulating layer is excellent, it is also possible to form at high yields, elements on the island having excellent characteristics and reliability. Moreover, instead of using a silicon substrate, other semiconductor substrates can also be used.

What is claimed is:

1. A semiconductor device for use in fabricating an integrated circuit, comprising:
   a semiconductor substrate having a pair of opposed surfaces;
   a buried insulating compound layer disposed within said substrate and at a predetermined depth from one surface thereof, said buried insulating compound layer being formed by implanting ions through said one surface;
   semiconductor circuit elements formed in an upper layer of said substrate lying between said buried insulating compound layer and said one surface, said circuit elements being incorporated into an island formed by selectively etching said upper layer; and
   an insulating film formed on the other surface of said substrate and having a thickness sufficient to compensate for the strain induced in said substrate during the formation of said buried insulating compound layer.

2. A semiconductor device according to claim 1 wherein said semiconductor substrate is comprised of a silicon wafer and said insulating film and said buried insulating compound layer are comprised of silicon dioxide.

3. A semiconductor device according to claim 1 wherein said island is completely surrounded by said buried insulating compound layer and another insulating film formed thereover.

4. A semiconductor device according to claim 3 wherein said island includes a source region, a drain region and a channel region, and wherein said semiconductor device further comprises a gate electrode formed over said channel region, and source and drain electrodes respectively connected to said source and drain regions through openings provided in said other insulating film.

5. A semiconductor device according to claim 3 wherein said island includes collector, base and emitter regions that constitute a vertical bipolar transistor, and said collector, base and emitter regions are connected to a collector electrode, a base electrode and an emitter electrode respectively, through openings provided in said other insulating film.

6. A semiconductor device according to claim 1 wherein a region of said layer of semiconductor substrate lying between said one surface and said buried insulating compound layer is converted into an insulating compound, and said island is bounded by said region of insulating compound, said buried insulating compound layer, and another insulating film disposed to lie over said one surface of said semiconductor substrate.

7. A semiconductor device according to claim 6 wherein said buried insulating compound layer has an opening provided therein for interconnecting said island and the layer of said semiconductor substrate lying between said buried insulating compound layer and said other surface of said substrate.

8. A semiconductor device according to claim 6 wherein said island includes source, drain and channel regions and wherein said semiconductor device further comprises a gate electrode overlying said channel region and said other insulating film, and source and drain electrodes respectively connected to said source and drain regions through openings provided in said other insulating film.

* * * * *